(12) United States Patent
Seo et al.

(10) Patent No.: US 8,598,968 B2
(45) Date of Patent: Dec. 3, 2013

(54) ELASTIC WAVE ELEMENT AND ELECTRONIC DEVICE USING THE SAME

(75) Inventors: Koji Seo, Kyoto (JP); Hiroyuki Nakamura, Osaka (JP); Rei Goto, Osaka (JP)

(73) Assignee: Panasonic Corporation, Osaka (JP)

( * ) Notice: Subject to any disclaimer, the term of this patent is extended or adjusted under 35 U.S.C. 154(b) by 367 days.

(21) Appl. No.: 13/124,685

(22) PCT Filed: Nov. 6, 2009

(86) PCT No.: PCT/JP2009/005900
§ 371 (c)(1),
(2), (4) Date: Apr. 18, 2011

(87) PCT Pub. No.: WO2010/052914
PCT Pub. Date: May 14, 2010

(65) Prior Publication Data
US 2011/0204998 A1    Aug. 25, 2011

(30) Foreign Application Priority Data

Nov. 10, 2008  (JP) ................................. 2008-287325

(51) Int. Cl.
*H03H 9/145* (2006.01)
*H03H 9/25* (2006.01)
*H03H 9/64* (2006.01)

(52) U.S. Cl.
USPC .......................... 333/193; 333/195; 310/313 B

(58) Field of Classification Search
USPC .................... 333/193–196; 310/313 B, 313 D
See application file for complete search history.

(56) References Cited

U.S. PATENT DOCUMENTS

| 5,923,231 | A * | 7/1999 | Ohkubo et al. ............... 333/193 |
| 7,209,018 | B2 * | 4/2007 | Nakao et al. ................... 333/195 |
| 7,466,061 | B2 * | 12/2008 | Miura et al. .............. 310/313 R |

(Continued)

FOREIGN PATENT DOCUMENTS

| JP | 2004-207996 | 7/2004 |
| JP | 2007-267366 | 10/2007 |

(Continued)

OTHER PUBLICATIONS

Y. Wang et al.; "A Full-Wave Analysis of Surface Acoustic Waves Propagating on a SiO2 Overlay/Metal Grating/Rotated YX-LiNbO3 Substrate Structure"; 2008 IEEE Ultrasonics Symposium, Nov. 2-5, 2008, pp. 1211-1214.*

(Continued)

*Primary Examiner* — Barbara Summons
(74) *Attorney, Agent, or Firm* — Wenderoth, Lind & Ponack, L.L.P.

(57) ABSTRACT

An elastic wave device has a convex portion on the top face of a first dielectric layer over an IDT electrode when the elastic wave device has a structure of a boundary wave device in which a film thickness of a second dielectric layer is not less than 1.6 times as much as a pitch width of the IDT electrode. This convex portion increases an electromechanical coupling coefficient of SH wave that is the major wave. Accordingly, good filter characteristics can be easily achieved.

7 Claims, 7 Drawing Sheets

(56) References Cited

U.S. PATENT DOCUMENTS

| | | | |
|---|---|---|---|
| 7,528,685 B2* | 5/2009 | Tanaka | 333/195 |
| 7,573,178 B2* | 8/2009 | Inoue et al. | 310/313 R |
| 7,619,347 B1* | 11/2009 | Bhattacharjee | 310/313 R |
| 8,264,122 B2* | 9/2012 | Mimura | 310/313 A |
| 8,294,330 B1* | 10/2012 | Abbott et al. | 310/313 A |
| 2006/0158800 A1 | 7/2006 | Takayama et al. | 361/56 |
| 2007/0132338 A1* | 6/2007 | Nakao et al. | 310/313 A |
| 2007/0229192 A1 | 10/2007 | Miura et al. | 333/193 |
| 2007/0241840 A1 | 10/2007 | Takayama et al. | 333/193 |
| 2008/0074212 A1 | 3/2008 | Matsuda et al. | 333/195 |
| 2008/0129418 A1* | 6/2008 | Miura et al. | 333/195 |
| 2009/0236935 A1 | 9/2009 | Kando | 310/313 R |
| 2009/0295508 A1* | 12/2009 | Isobe et al. | 333/195 |

FOREIGN PATENT DOCUMENTS

| | | | |
|---|---|---|---|
| JP | 2008-67289 | * | 3/2008 |
| JP | 2008-079227 | | 4/2008 |
| WO | 98/52279 | | 11/1998 |
| WO | 2006/003933 | | 1/2006 |
| WO | 2008/078481 | | 7/2008 |

OTHER PUBLICATIONS

International Search Report issued Dec. 22, 2009 in International (PCT) Application No. PCT/JP2009/005900.

* cited by examiner

FIG. 10 – PRIOR ART
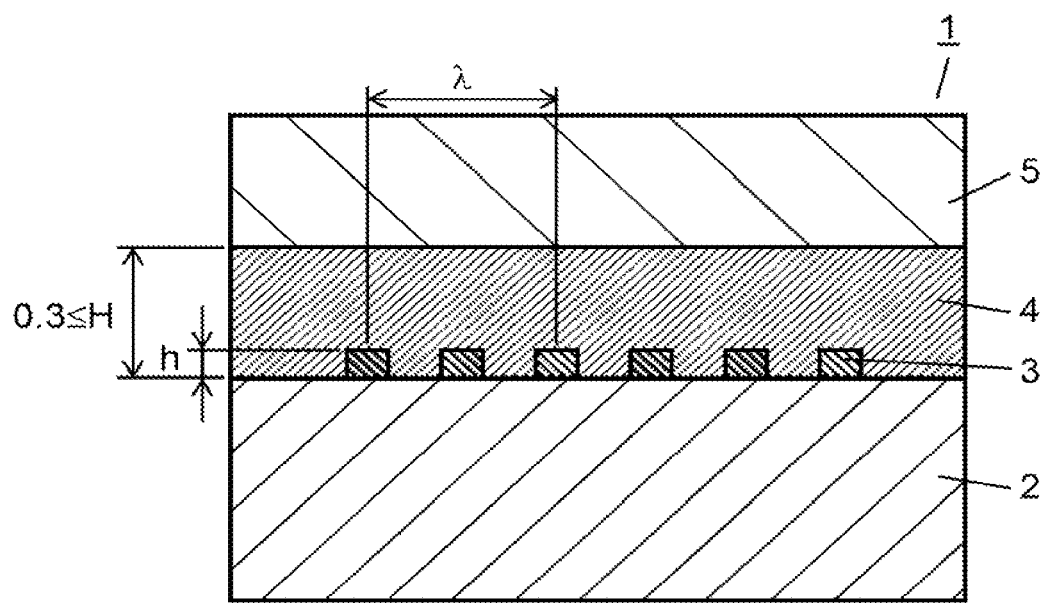

ELASTIC WAVE ELEMENT AND ELECTRONIC DEVICE USING THE SAME

This application is a U.S. national phase application of PCT International Application PCT/JP2009/005900, filed Nov. 6, 2009.

TECHNICAL FIELD

The present invention relates to an elastic wave device and electronic equipment using this elastic wave device.

BACKGROUND ART

FIG. 10 is a schematic sectional view of a conventional elastic wave device. In FIG. 10, conventional elastic wave device 1 includes piezoelectric substrate 2 made of lithium niobate, IDT (Interdigital Transducer) electrode 3 disposed on piezoelectric substrate 2, first dielectric layer 4 made of silicon oxide and disposed on piezoelectric substrate 2 such that it covers IDT electrode 3, and second dielectric layer 5 made of a medium that propagates transverse waves faster than that on first dielectric layer 4. Second dielectric layer 5 is disposed on first dielectric layer 4.

A known prior art related to the present invention is, for example,

Japanese Patent Unexamined Publication No. 2007-267366.

The above conventional elastic wave device 1 suppresses an electromechanical coupling coefficient of Stoneley wave, which is an undesired wave, by specifying a film thickness of first dielectric layer 4, a film thickness of IDT electrode 3, and a cut angle of the substrate. However, an electromechanical coupling coefficient of SH wave, which is a major wave, is only 0.15 at maximum. Therefore, if conventional elastic wave device 1 is applied to a duplexer having a wide transmission gap, such as Band I of UMTS, it is difficult to gain good filter characteristics.

SUMMARY OF THE INVENTION

The present invention improves an electromechanical coupling coefficient of a major wave. A characteristic of an elastic wave device of the present invention is that a first dielectric layer has a convex portion on its top face over an IDT electrode if the elastic wave device has a structure that a film thickness of a second dielectric layer is not less than 1.6 times as much as a pitch width p of the IDT electrode.

The above convex portion of the elastic wave device of the present invention increases the electromechanical coupling coefficient of SH wave that is the major wave. If this elastic wave device is applied to a duplexer with a wide transmission band gap, such as Band I of UMTS, good filter characteristics can be easily achieved.

BRIEF DESCRIPTION OF DRAWINGS

FIG. 10 is a schematic sectional view of a conventional elastic wave device along the propagating direction of the major wave.

DETAILED DESCRIPTION OF PREFERRED EMBODIMENTS

First Exemplary Embodiment

Figure 1:
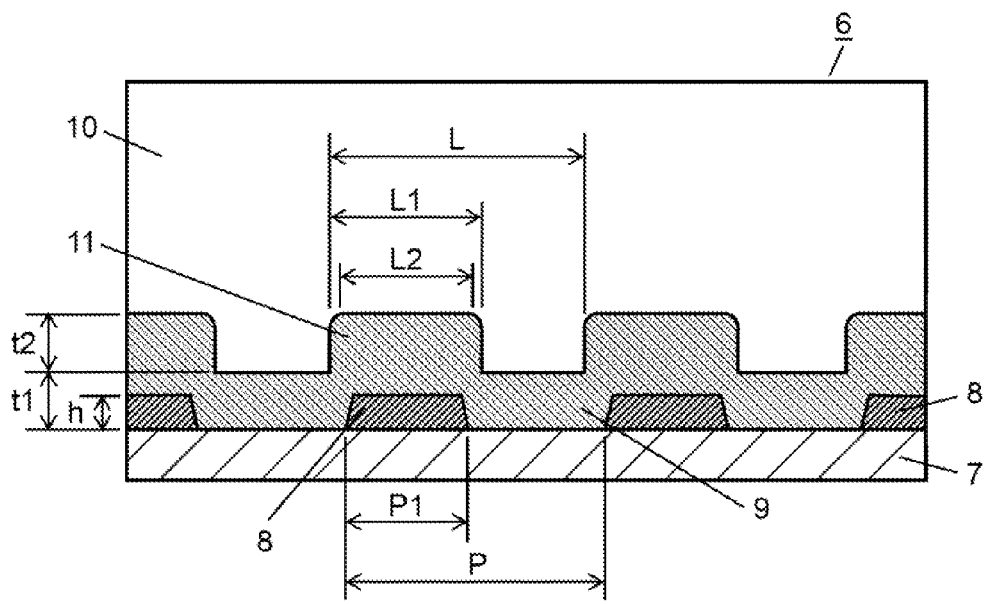
FIG. 1 is a schematic sectional view of an elastic wave device along the propagating direction of the major wave in accordance with a first exemplary embodiment of the present invention.

FIG. 1 is a schematic sectional view of an elastic wave device in the first exemplary embodiment of the present invention. In FIG. 1, elastic wave device 6 includes piezoelectric substrate 7, IDT electrode 8 disposed on this piezoelectric substrate 7, first dielectric layer 9 made of silicon oxide and formed on piezoelectric substrate 7 such that it covers IDT electrode 8, and second dielectric layer 10 made of a medium that propagates transverse waves faster than transverse waves propagating on first dielectric layer 9. Second dielectric layer 10 is disposed on this first dielectric layer 9. First dielectric layer 9 has convex portion 11 on its top face over IDT electrode 8. If a pitch width of convex portion is L, and a pitch width of IDT electrode 9 is p, L≈p is satisfied.

Piezoelectric substrate 7 is made of, for example, lithium niobate, lithium tantalate, or potassium niobate.

IDT electrode 8 is, for example, made of copper (specific gravity: 8.95) or metal mainly constituted of copper. However, the material of IDT electrode 8 is not limited.

First dielectric layer 9 is, for example, made of silicon oxide. However, first dielectric layer 9 may be any medium that has a frequency-temperature characteristic opposite to that of piezoelectric substrate 7. This can improve the frequency-temperature characteristic.

Second dielectric layer 10 is formed of a medium that propagates transverse waves faster than the speed of transverse waves propagating on first dielectric layer 9. For example, diamond, silicon, silicon nitride, aluminum nitride, or aluminum oxide is used. The film thickness of this second dielectric layer 10 is not less than 1.6 times as much as pitch width p of IDT electrode 8. This enables to trap energy of SH wave, which is the major wave, inside elastic wave device 6.

Elastic wave device 6 has height t1 from a boundary face between piezoelectric substrate 7 and first dielectric layer 9 to the bottom end of convex portion 11. Height t2 is from the top end of convex portion 11 to the bottom end of convex portion 11. If a film thickness of IDT electrode 8 is h, and a wavelength of SH wave that is the major wave excited by IDT electrode 8 is λ, t1≤0.28λ and 0<t2≤1.5 h, or 0.28<t1≤0.3λ and 0<t2≤0.58 h are satisfied. If a width at the bottom end of convex portion 11 is L1, and a width at the top end of convex portion 11 is L2, L2≤L1 is satisfied. If these conditions are satisfied, an electromechanical coupling coefficient of SH wave that is the major wave becomes particularly large. Accordingly, if elastic wave device 6 is applied to a duplexer with a broad transmission band gap, such as Band I of UMTS, good filter characteristics can be easily achieved. This is described below with reference to FIGS. 2 to 6.

Figure 2:
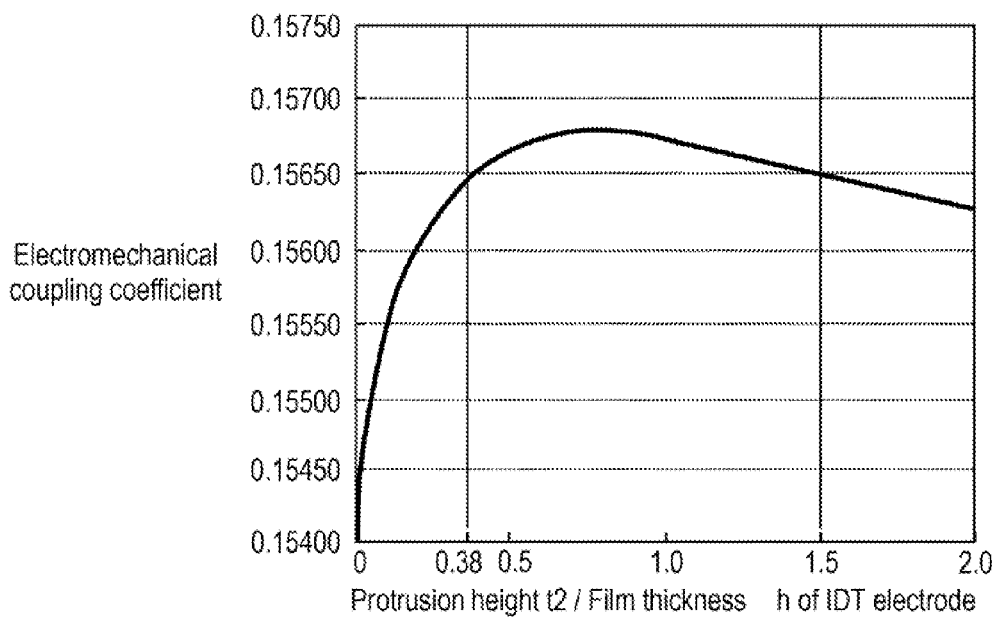
FIG. 2 is a chart illustrating a characteristic of the elastic wave device in accordance with the first exemplary embodiment of the present invention.

FIG. 2 shows a characteristic of the elastic wave device in the first exemplary embodiment of the present invention. More specifically, it shows changes in the electromechanical coupling coefficient of the major wave of elastic wave device 6 when height t2 of convex portion 11 is changed while film thickness t1 of first dielectric layer 9 is 0.25λ. In FIG. 2, the horizontal axis is (convex portion height t2)/(film thickness h of IDT electrode), and the vertical axis is the electromechanical coupling coefficient of the major wave.

Here, piezoelectric substrate 7 is 25-degree rotated Y-cut lithium niobate substrate. IDT electrode 8 is copper with film thickness of 0.1λ. First dielectric layer 9 is silicon oxide with film thickness t1 of 0.25λ, and second dielectric layer 10 is silicon nitride with film thickness of λ. Width L1 at the bottom end of convex portion 11 is the same as electrode finger width p1 of IDT electrode 8. The direction of electrode finger width p1 of IDT electrode 8 is the same as the propagating direction of the major wave.

As shown in FIG. 2, convex portion 11 improves the electromechanical coupling coefficient of the major wave of elastic wave device 6. In particular, when height t2 of convex portion 11 is not less than 0.038λ and not greater than 0.15λ, i.e., when not less than 0.38 times and not greater than 1.5 times as much as film thickness h of IDT electrode 8, the electromechanical coupling coefficient of the major wave of elastic wave device 6 further improves.

Figure 3:
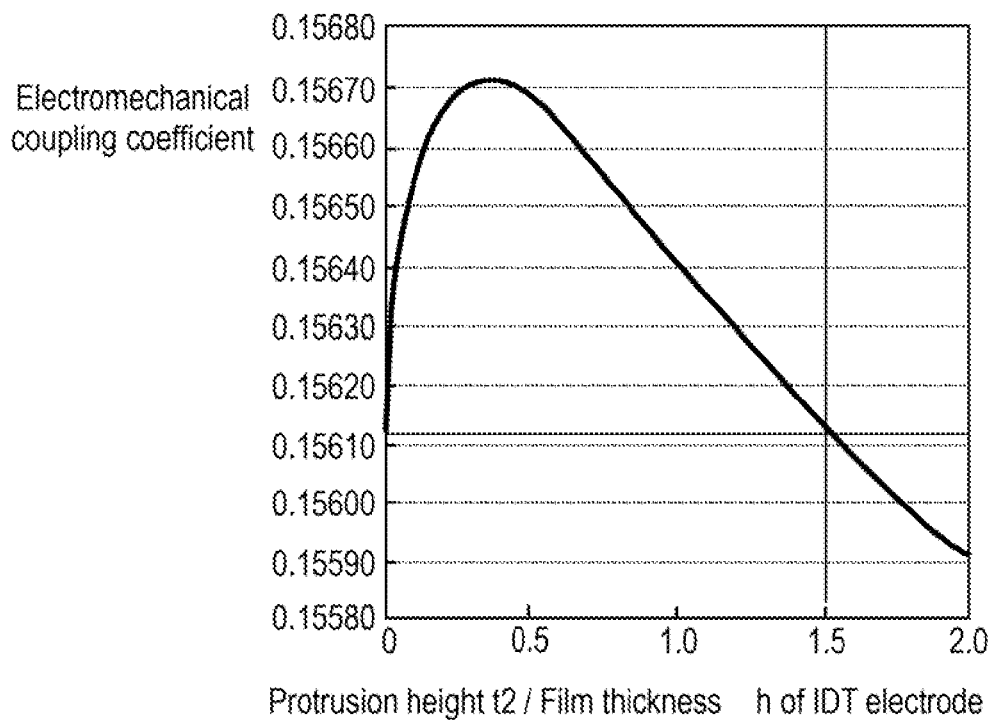
FIG. 3 is a chart illustrating a characteristic of the elastic wave device in accordance with the first exemplary embodiment of the present invention.

FIG. 3 illustrates a characteristic of the elastic wave device in the first exemplary embodiment of the present invention. More specifically, it shows changes in the electromechanical coupling coefficient of the major wave of elastic wave device 6 when height t2 of convex portion 11 is changed while film thickness t1 of first dielectric layer 9 is 0.28λ. In FIG. 3, the horizontal axis is (convex portion height t2)/(film thickness h of IDT electrode), and the vertical axis is the electromechanical coupling coefficient of the major wave.

Here, as in the case of FIG. 2, piezoelectric substrate 7 is a 25-degree rotated Y-cut lithium niobate substrate. IDT electrode 8 is copper with film thickness of 0.1λ. First dielectric layer 9 is silicon oxide with film thickness t1 of 0.28λ, and second dielectric layer 10 is silicon nitride with film thickness of λ. Bottom end width L1 of convex portion 11 and top end width L2 of convex portion 11 are equivalent to electrode finger width p1 of IDT electrode 8.

As shown in FIG. 3, the electromechanical coupling coefficient of the major wave of elastic wave device 6 improves when height t2 of convex portion 11 is not greater than 0.15λ, i.e., not greater than 1.5 times as much as film thickness h of IDT electrode 8.

Figure 4:
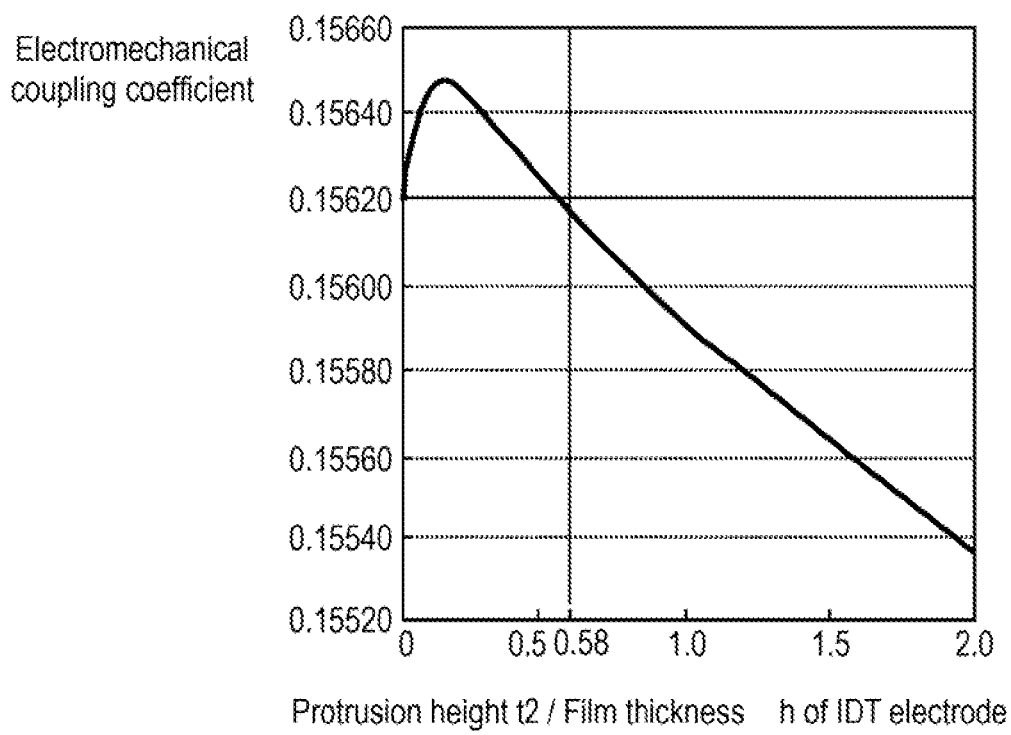
FIG. 4 is a chart illustrating a characteristic of the elastic wave device in accordance with the first exemplary embodiment of the present invention.

FIG. 4 illustrates a characteristic of the elastic wave device in the first exemplary embodiment of the present invention. More specifically, it shows changes in the electromechanical coupling coefficient of the major wave of elastic wave device 6 when height t2 of convex portion 11 is changed while film thickness t1 of first dielectric layer 9 is 0.3λ. In FIG. 4, the horizontal axis is (convex portion height t2)/(film thickness h of IDT electrode), and the vertical axis is the electromechanical coupling coefficient of the major wave.

Here, as in the case of FIG. 2, piezoelectric substrate 7 is a 25-degree rotated Y-cut lithium niobate substrate. IDT electrode 8 is copper with film thickness of 0.1λ. First dielectric layer 9 is silicon oxide with film thickness t1 of 0.23λ, and second dielectric layer 10 is silicon nitride with film thickness of λ. Bottom end width L1 of convex portion 11 and top end width L2 of convex portion 11 are equivalent to electrode finger width p1 of IDT electrode 8.

As shown in FIG. 4, the electromechanical coupling coefficient of the major wave of elastic wave device 6 improves when height t2 of convex portion 11 is not greater than 0.058λ, i.e., not greater than 0.58 times as much as film thickness h of IDT electrode 8.

Figure 5:
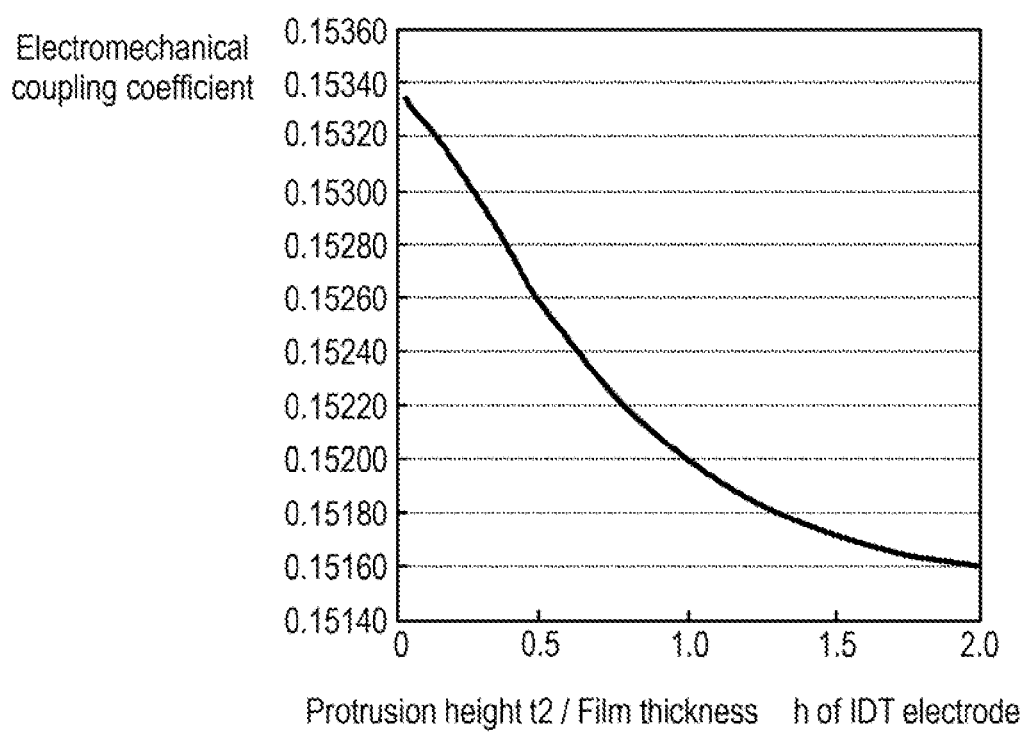
FIG. 5 is a chart illustrating a characteristic of the elastic wave device in accordance with the first exemplary embodiment of the present invention.

FIG. 5 illustrates a characteristic of the elastic wave device in the first exemplary embodiment of the present invention. More specifically, it shows changes in the electromechanical coupling coefficient of the major wave of elastic wave device 6 when height t2 of convex portion 11 is changed while film thickness t1 of first dielectric layer 9 is 0.4λ. In FIG. 5, the horizontal axis is (convex portion height t2)/(film thickness h of IDT electrode), and the vertical axis is the electromechanical coupling coefficient of the major wave.

Here, as in the case of FIG. 2, piezoelectric substrate 7 is a 25-degree rotated Y-cut lithium niobate substrate. IDT electrode 8 is copper with film thickness of 0.1λ. First dielectric layer 9 is silicon oxide with film thickness t1 of 0.4λ, and second dielectric layer 10 is silicon nitride with film thickness of λ. Bottom end width L1 of convex portion 11 and top end width L2 of convex portion 11 are equivalent to electrode finger width p1 of IDT electrode 8.

As shown in FIG. 5, the electromechanical coupling coefficient of the major wave of elastic wave device 6 deteriorates due to convex portion 11 in all cases regardless of height t2 of convex portion 11.

It is apparent from FIGS. 2 to 5 that the electromechanical coupling coefficient of SH wave, which is the major wave, improves when convex portion height t2 is not greater than 1.5 times as much as film thickness h of IDT electrode 8 while height t1 from the boundary face between piezoelectric substrate 7 and first dielectric layer 9 to the bottom end of convex portion 11 is not less than 0.25λ and not greater than 0.28λ, or t2 is not greater than 0.58 times as much as h while t1 is more than 0.28λ and not greater than 0.3λ.

Figure 6:
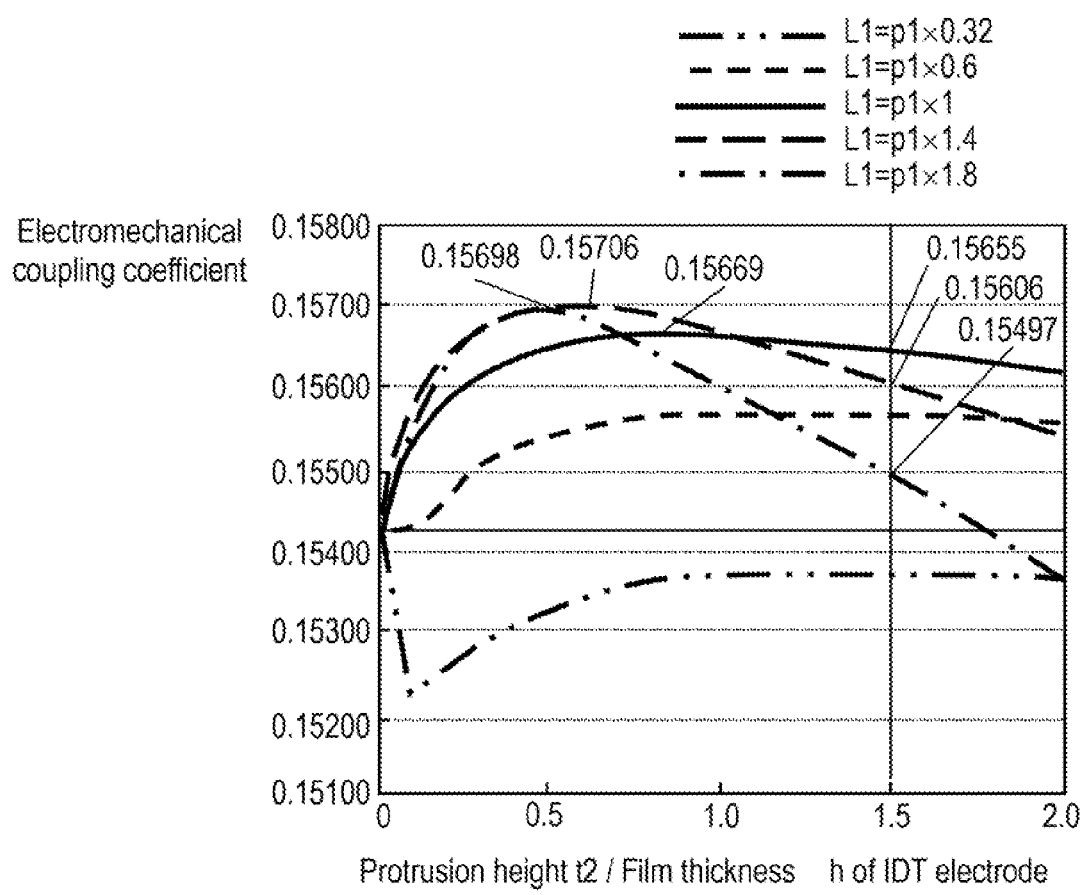
FIG. 6 is a chart illustrating a characteristic of the elastic wave device in accordance with the first exemplary embodiment of the present invention.

FIG. 6 illustrates a characteristic of the elastic wave device in the first exemplary embodiment of the present invention. More specifically, it shows changes in the electromechanical coupling coefficient of the major wave of elastic wave device 6 when height t2 of convex portion 11 changes while film thickness t1 of first dielectric layer 9 is 0.25λ and bottom end width L1 of convex portion 11 and top end width L2 of convex portion 11 is 0.32 times, 0.6 times, 1 times, 1.4 times, or 1.8 times as much as electrode finger width p1 of IDT electrode 8.

Here, as in the case of FIG. 2, piezoelectric substrate 7 is a 25-degree rotated Y-cut lithium niobate substrate. IDT electrode 8 is copper with film thickness of 0.1λ. First dielectric layer 9 is silicon oxide with film thickness t1 of 0.25λ, and second dielectric layer 10 is silicon nitride with film thickness of λ.

As shown in FIG. 6, the electromechanical coupling coefficient of SH wave, which is the major wave, improves under conditions of 0<t1≤0.28λ and 0<t2≤1.5 h, or 0.28<t1≤0.3λ and 0<t2≤0.58 h when bottom end width L1 of convex portion 11 is both longer and shorter than electrode finger width p1 of IDT electrode. If bottom end width L1 of convex portion 11 is smaller than 0.5 times as much as electrode finger width p1 of IDT electrode 8, i.e., if bottom end width L1 of convex portion 11 is 0.32 times as much as electrode finger width p1 of the IDT electrode, for example, the electromechanical coupling coefficient of SH wave, which is the major wave, deteriorates.

Figure 7:
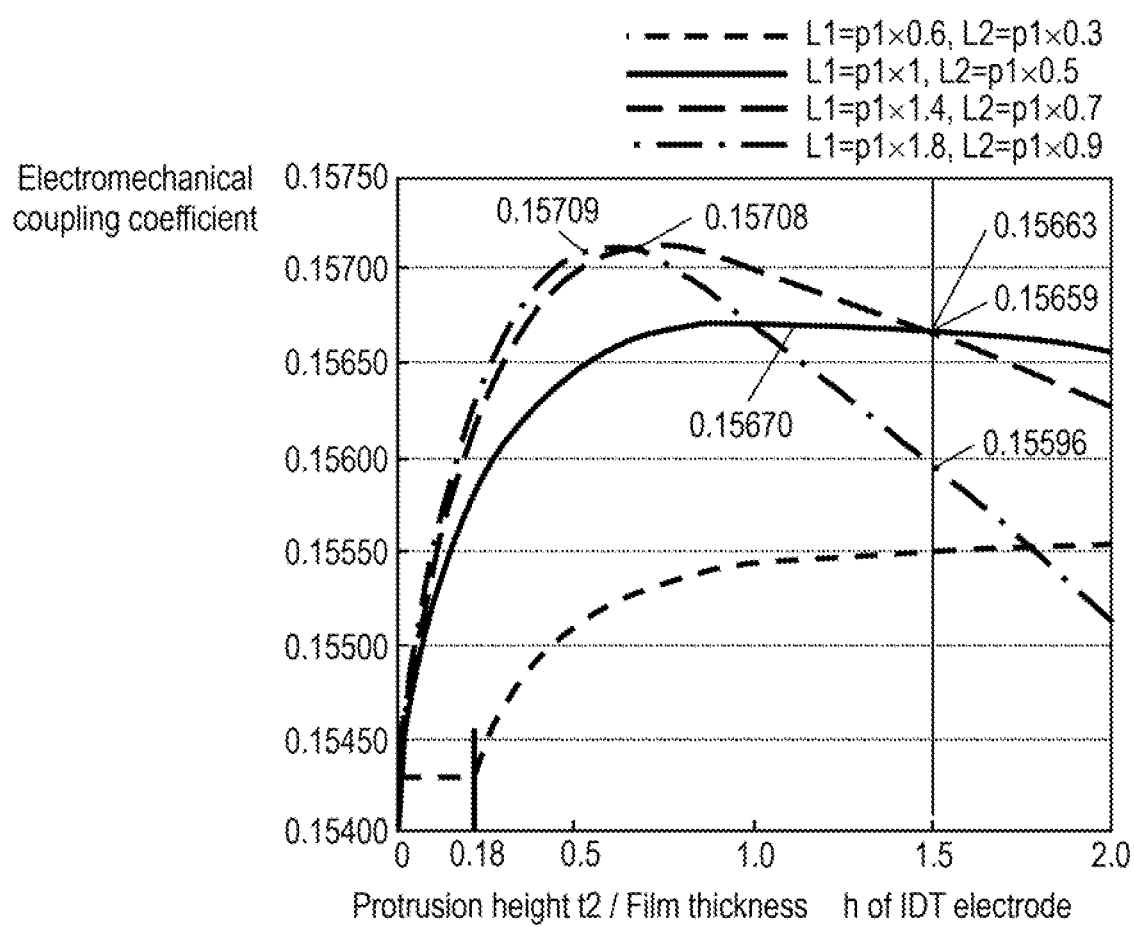
FIG. 7 is a chart illustrating a characteristic of the elastic wave device in accordance with the first exemplary embodiment of the present invention.

FIG. 7 illustrates a characteristic of the elastic wave device in the first exemplary embodiment of the present invention. More specifically, it shows the characteristic of elastic wave device 6 when convex portion 11 is narrowed upward if bottom end width L1 and top end width L2 of convex portion 11 satisfy a relation of L2<L1.

FIG. 7 shows changes in the electromechanical coupling coefficient of the major wave of elastic wave device 6 when height t2 of convex portion 11 is changed while film thickness t1 of first dielectric layer 9 is 0.25λ, and also bottom end width L1 of convex portion 11 is 0.6 times as much as electrode finger width p1 of IDT electrode and top end width L2 of convex portion 11 is 0.3 times as much as electrode finger width p1 of IDT electrode; bottom end width L1 of convex portion 11 is as much as electrode finger width p1 of IDT electrode 8 and top end width L2 of convex portion 11 is 0.5 times as much as electrode finger width p1 of IDT electrode 8; bottom end width L1 of convex portion 11 is 1.4 times as much as electrode finger width p1 of IDT electrode 8 and top end width L2 of convex portion 11 is 0.7 times as much as electrode finger width p1 of IDT electrode 8; or bottom end width L1 of convex portion 11 is 1.8 times as much as electrode finger width p1 of IDT electrode and top end width L2 of convex portion 11 is 0.9 times as much as electrode finger width p1 of IDT electrode 8. In FIG. 7, the horizontal axis is (convex portion height t2)/(film thickness h of IDT electrode), and the vertical axis is the electromechanical coupling coefficient of the major wave.

Here, as in the case of FIG. 2, piezoelectric substrate 7 is a 25-degree rotated Y-cut lithium niobate substrate. IDT electrode 8 is copper with film thickness of 0.1λ. First dielectric layer 9 is silicon oxide with film thickness t1 of 0.25λ, and second dielectric layer 10 is silicon nitride with film thickness of λ. In this case, when bottom end width L1 of convex portion 11 is wider than electrode finger width p1 of IDT electrode 8, in particular, the electromechanical coupling coefficient of the major wave of elastic wave device 6 whose shape of the convex portion is L2<L1 becomes further greater than the electromechanical coupling coefficient of the major wave of elastic wave device 6 whose shape of convex portion is L1=L2.

As a method of achieving the above shape of first dielectric layer 9, a film is formed by sputtering while applying bias to the side of piezoelectric substrate 7, so-called bias sputtering, in the manufacturing process of elastic wave device 6.

For example, by sputtering a silicon-oxide target, first dielectric layer 9 is deposited on piezoelectric substrate 7, and also at the same time, a part of first dielectric layer 9 on piezoelectric substrate 7 is bias-sputtered. In other words, a part of first dielectric layer 9 is removed while being deposited so as to control the shape of first dielectric layer 9. In this case, the shape of first dielectric layer 9 is controlled by changing the ratio of bias applied to piezoelectric substrate 7 to the sputtering power in the middle of deposition of first dielectric layer 9, or by depositing a film on piezoelectric substrate 7 without applying bias at an initial period of forming the film and then also applying bias in the middle of film deposition. In this case, the temperature of piezoelectric substrate 7 is also controlled.

Figure 8:
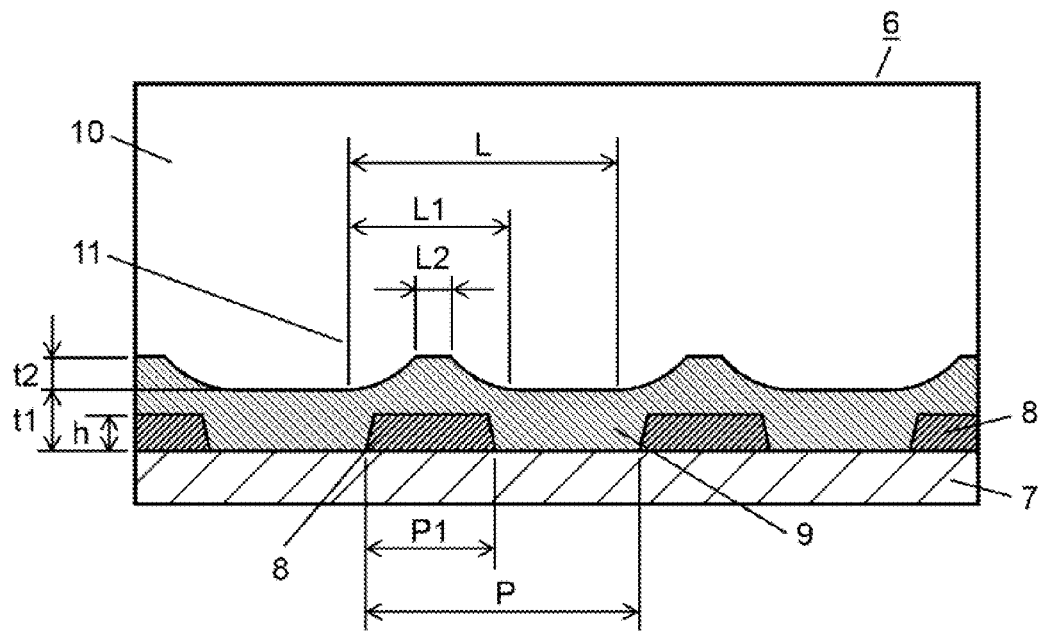
FIG. 8 is another schematic sectional view of the elastic wave device along the propagating direction of the major wave in accordance with the first exemplary embodiment of the present invention.

FIG. 8 is a schematic sectional view of another elastic wave device in the first exemplary embodiment of the present invention. In FIG. 8, the electromechanical coupling coefficient of the major wave of elastic wave device 6 further increases by making top end width L2 of convex portion 11 narrower than electrode finger width p1 of IDT electrode 8. In addition, reflection ratio of IDT electrode 8 increases by the mass addition effect of first dielectric layer 9. This improves electric characteristics of elastic wave device 6.

Convex portion 11 preferably has a concave and convex shape that forms a convex curve downward from the top end to the bottom end of convex portion 11. This achieves successive and moderate change of mass addition effect of first dielectric layer 9 on convex portion 11. As a result, the electromechanical coupling coefficient of the major wave of elastic wave device 6 can be improved while suppressing generation of undesired reflection caused by the shape of first dielectric layer 9.

Still more, the top end width of convex portion 11 is preferably not greater than ½ of the electrode finger width of IDT electrode 8. In addition, the center position of the top end of convex portion 11 is preferably and substantially over the finger center position of IDT electrode 8. This further improves electric characteristics of elastic wave device 6.

Still more, when t2 is the height of convex portion 11 and h is the film thickness of IDT electrode 8, t2 preferably satisfies a relation of 0.18λ<t2≤h. This is because, as shown in FIG. 7, if t2 is not less than 0.18λ when 0.6≤L1/p1≤1.8, the electromechanical coupling coefficient of the major wave improves compared to first dielectric layer 9 with flat surface.

On the other hand, if t2 is greater than film thickness h of IDT electrode 8, a new process needs to be added in order to create this first dielectric layer 9. The manufacturing method thus becomes more complicated.

In the above description, IDT electrode 8 is metal mainly constituted of copper. However, IDT electrode 8 is not limited to copper.

Figure 9:
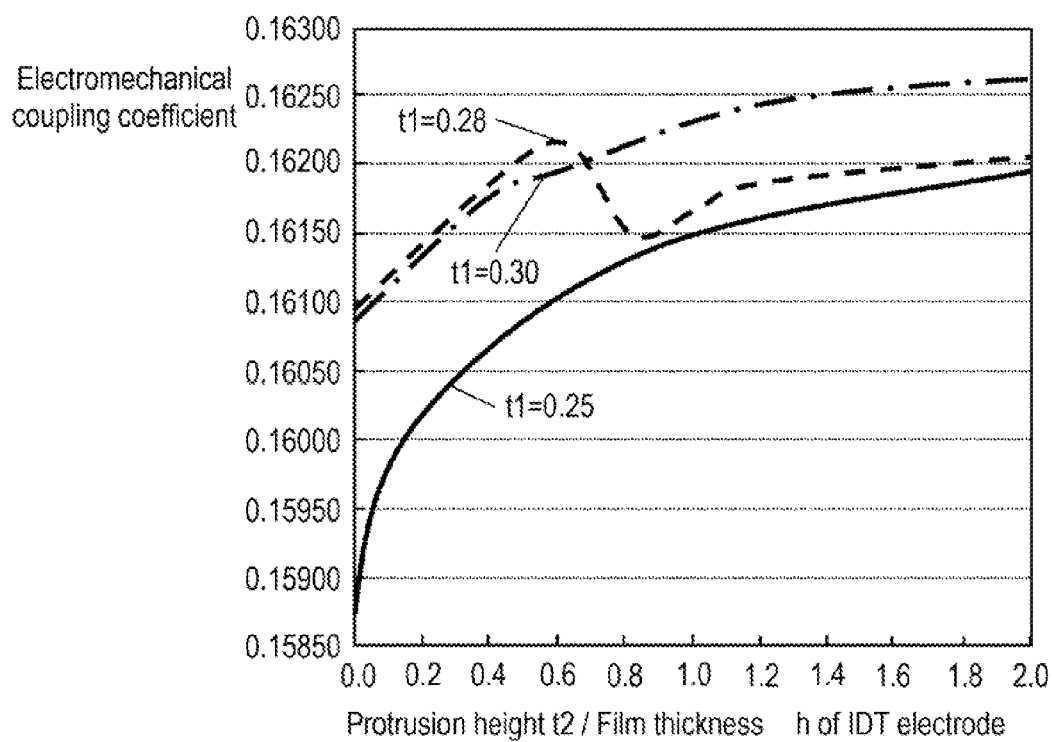
FIG. 9 is a chart illustrating a characteristic of the elastic wave device in accordance with the first exemplary embodiment of the present invention.

FIG. 9 illustrates a characteristic of the elastic wave device in the first exemplary embodiment of the present invention. More specifically, it shows changes in the electromechanical coupling coefficient of the major wave of elastic wave device 6 when height t2 of convex portion 11 is changed while film thickness t1 of first dielectric layer 9 is 0.25λ, 0.28λ, or 0.3λ in the case that IDT electrode 9 is molybdenum (specific gravity: 10.22). In FIG. 9, the horizontal axis is (convex portion height t2)/(film thickness h of IDT electrode), and the vertical axis is the electromechanical coupling coefficient of the major wave.

Here, piezoelectric substrate 7 is a 25-degree rotated Y-cut lithium niobate substrate, and IDT electrode 8 is molybdenum with film thickness of 0.1λ. First dielectric layer 9 is made of silicon oxide with film thickness t1 of 0.28λ, and second dielectric layer 10 is made of silicon nitride with film thickness of λ. Bottom end width L1 of convex portion 11 and top end width L2 of convex portion 11 are the same as electrode finger width p1 of IDT electrode 8. Accordingly, the electromechanical coupling coefficient of the major wave of elastic wave device 6 improves also when materials other than copper, such as molybdenum, are used for the IDT electrode.

Elastic wave device 6 in the first exemplary embodiment may be applied to a resonator (not illustrated), or a filter (not illustrated) such as a ladder filter and DMS filter. In addition, elastic wave device 6 may be applied to electronic equipment including this filter, a semiconductor integrated circuit device (not illustrated) connected to the filter, and a reproducing unit, such as a speaker and display unit, connected to the semiconductor integrated circuit device (not illustrated). This improves the communications quality of a resonator, filter, and electronic equipment.

The elastic wave device of the present invention has a characteristic of increasing the electromechanical coupling coefficient of the major wave, and is applicable to electronic equipment such as mobile phones.

The invention claimed is:

1. An elastic wave device comprising:
    a piezoelectric substrate;
    an IDT electrode disposed on the piezoelectric substrate;
    a first dielectric layer disposed on the piezoelectric substrate, the first dielectric layer covering the IDT electrode and being made of a medium with a frequency-temperature characteristic opposite to that of the piezoelectric substrate; and
    a second dielectric layer disposed on the first dielectric layer, the second dielectric layer being made of a medium that propagates a transverse wave faster than a speed of a transverse wave propagating on the first dielectric layer;
    wherein the first dielectric layer has a convex portion on a top face of the first dielectric layer, the convex portion being provided over the IDT electrode; and
    wherein a relation of one of $0 < t1 \leq 0.28\lambda$ and $0 < t2 \leq 1.5h$, and $0.28 < t1 \leq 0.3\lambda$ and $0 < t2 \leq 0.58h$ is satisfied, where
    t1 is a height from a boundary face between the piezoelectric substrate and the first dielectric layer to a bottom end of the convex portion,
    t2 is a height from a top end of the convex portion to the bottom end of the convex portion,
    h is a film thickness of the IDT electrode, and
    $\lambda$ is a wavelength of a major wave excited by the IDT electrode.

2. The elastic wave device of claim 1, wherein
    a film thickness of the second dielectric layer is not less than 1.6 times as much as a pitch width of the IDT electrode.

3. The elastic wave device of claim 1, wherein
    a relation of $0.6 \leq L1/p1 \leq 1.8$ is satisfied, where p1 is an electrode finger width of the IDT electrode, and
    L1 is a width at the bottom end of the convex portion.

4. The elastic wave device of claim 1, wherein
    a relation of $L2 < L1$ is satisfied, where L2 is a width at the top end of the convex portion, and L1 is a width at the bottom end of the convex portion.

5. An elastic wave device comprising:
    a piezoelectric substrate;
    an IDT electrode disposed on the piezoelectric substrate;
    a first dielectric layer disposed on the piezoelectric substrate, the first dielectric layer covering the IDT electrode and being made of a medium with a frequency-temperature characteristic opposite to that of the piezoelectric substrate; and
    a second dielectric layer disposed on the first dielectric layer, the second dielectric layer being made of a medium that propagates a transverse wave faster than a speed of a transverse wave propagating on the first dielectric layer;
    wherein the first dielectric layer has a convex portion on a top face of the first dielectric layer, the convex portion being provided over the IDT electrode; and
    wherein a relation of $L2 < L1$ is satisfied where L2 is a width at the top end of the convex portion, and L1 is a width at the bottom end of the convex portion.

6. An elastic wave device comprising:
    a piezoelectric substrate;
    an IDT electrode disposed on the piezoelectric substrate;
    a first dielectric layer disposed on the piezoelectric substrate, the first dielectric layer covering the IDT electrode and being made of a medium with a frequency-temperature characteristic opposite to that of the piezoelectric substrate; and
    a second dielectric layer disposed on the first dielectric layer, the second dielectric layer being made of a medium that propagates a transverse wave faster than a speed of a transverse wave propagating on the first dielectric layer;
    wherein the first dielectric layer has a convex portion on a top face of the first dielectric layer, the convex portion being provided over the IDT electrode; and
    wherein a film thickness of the second dielectric layer is not less than 1.6 times as much as a pitch width of the IDT electrode.

7. An elastic wave device comprising:
    a piezoelectric substrate;
    an IDT electrode disposed on the piezoelectric substrate;
    a first dielectric layer disposed on the piezoelectric substrate, the first dielectric layer covering the IDT electrode and being made of a medium with a frequency-temperature characteristic opposite to that of the piezoelectric substrate; and
    a second dielectric layer disposed on the first dielectric layer, the second dielectric layer being made of a medium that propagates a transverse wave faster than a speed of a transverse wave propagating on the first dielectric layer;
    wherein the first dielectric layer has a convex portion on a top face of the first dielectric layer, the convex portion being provided over the IDT electrode; and
    wherein a relation of $0.6 \leq L1/p1 \leq 1.8$ is satisfied, where p1 is an electrode finger width of the IDT electrode; and
    L1 is a width at the bottom end of the convex portion.

* * * * *